United States Patent
Jiang et al.

(10) Patent No.: US 12,188,973 B2
(45) Date of Patent: Jan. 7, 2025

(54) SINGLE-PHASE FAULT ARC DETECTOR

(71) Applicant: Hunan Smart Quick Smart Electronic Technology Co., Ltd., Shaoyang (CN)

(72) Inventors: Shijun Jiang, Shaoyang (CN); Xintao Du, Shaoyang (CN)

(73) Assignee: Hunan Smart Quick Smart Electronic Technology Co., Ltd., Shaoyang (CN)

(*) Notice: Subject to any disclaimer, the term of this patent is extended or adjusted under 35 U.S.C. 154(b) by 193 days.

(21) Appl. No.: 17/963,351

(22) Filed: Oct. 11, 2022

(65) Prior Publication Data

US 2023/0115022 A1   Apr. 13, 2023

(30) Foreign Application Priority Data

Oct. 11, 2021 (CN) .......................... 202111180844.5

(51) Int. Cl.
*G01R 31/14* (2006.01)
*G01R 31/08* (2020.01)

(52) U.S. Cl.
CPC ........... *G01R 31/14* (2013.01); *G01R 31/085* (2013.01)

(58) Field of Classification Search
CPC ... G01R 31/14; G01R 31/085; G01R 31/1272
See application file for complete search history.

(56) References Cited

U.S. PATENT DOCUMENTS

2014/0278158 A1* 9/2014 Miller ................... G01R 31/14
702/58

FOREIGN PATENT DOCUMENTS

| CN | 105527549 | A | * | 4/2016 |
| CN | 111884171 | A | | 11/2020 |
| CN | 214337564 | U | | 10/2021 |
| CN | 215219033 | U | | 12/2021 |

* cited by examiner

*Primary Examiner* — Feba Pothen
(74) *Attorney, Agent, or Firm* — Nitin Kaushik

(57) ABSTRACT

The present disclosure discloses a single-phase fault arc detector. A fault arc signal processing circuit performs processing to obtain a voltage square wave signal, a voltage sine wave signal, a current sine wave signal, a current square wave signal, a current square shoulder pulse signal, and a current high-frequency pulse signal, and a processor accurately determines, on the basis of the plurality of obtained current signals and voltage signals and in combination with a preset operation rule, whether there is a single-phase fault arc in a power utilization line. Correlated characteristics of square shoulder parts may be accurately recognized by accurately extracting the current square shoulder pulse signal from current sampling signals; then, characteristics such as the number and durations of the square shoulder parts as well as current values may be comprehensively recognized on the basis of the current square shoulder pulse signal and the current high-frequency pulse signal.

9 Claims, 17 Drawing Sheets

1: Voltage square wave    2: Voltage sine    3: Current square wave
4: Current sine    5: Square shoulder pulse    6: High-frequency pulse

SINGLE-PHASE FAULT ARC DETECTOR

CROSS-REFERENCE TO RELATED APPLICATIONS

The application claims priority to Chinese patent application No. 202111180844.5, filed on Oct. 11, 2021, the entire contents of which are incorporated herein by reference.

TECHNICAL FIELD

The present disclosure relates to the technical field of fault arc detection, in particular to a single-phase fault arc detector.

BACKGROUND

A fault arc is a common potential safety hazard in a line of an electrical appliance, and it often occurs in a line poor in insulation or contact, and may also occur in a loose wire junction or an aged or damaged line, and therefore, accurate detection for fault arcs existing in a power utilization line is of great importance to the safety of power utilization.

SUMMARY

The present disclosure provides a single-phase fault arc detector by which fault arcs existing in a power utilization line can be accurately detected, so that the safety of power utilization is guaranteed.

According to one aspect of the present disclosure, provided is a single-phase fault arc detector used to detect a single-phase fault arc, including:
  a power conversion circuit connected to the live wire and neutral wire of a mains supply and configured to provide various power voltages and voltage sampling signals;
  a current signal input circuit connected to a current transformer and configured to provide current sampling signals;
  a fault arc signal processing circuit respectively connected to the power conversion circuit and the current signal input circuit and configured to process the voltage sampling signals and the current sampling signals and then output a voltage square wave signal, a voltage sine wave signal, a current sine wave signal, a current square wave signal, a current square shoulder pulse signal, and a current high-frequency pulse signal; and
  a processor respectively connected to the power conversion circuit and the fault arc signal processing circuit and configured to determine, on the basis of the plurality of current signals and voltage signals output by the fault arc signal processing circuit and in combination with a preset operation rule, whether there is a single-phase fault arc.

Further, the fault arc signal processing circuit includes a voltage signal processing circuit and a current signal processing circuit; the voltage signal processing circuit is respectively connected to the power conversion circuit and the processor and is configured to respectively convert the voltage sampling signals into the voltage sine wave signal and the voltage square wave signal and then output the voltage sine wave signal and the voltage square wave signal to the processor; and the current signal processing circuit is respectively connected to the current signal input circuit and the processor and is configured to respectively convert the current sampling signals into the current sine wave signal, the current square wave signal, the current square shoulder pulse signal and the current high-frequency pulse signal and then output the current sine wave signal, the current square wave signal, the current square shoulder pulse signal and the current high-frequency pulse signal to the processor.

Further, the current signal processing circuit includes a square shoulder pulse signal extraction circuit and a high-frequency pulse signal extraction circuit; the square shoulder pulse signal extraction circuit is respectively connected to the current signal input circuit and the processor and is configured to respectively convert the current sampling signals into the current sine wave signal, the current square wave signal and the current square shoulder pulse signal and then output the current sine wave signal, the current square wave signal and the current square shoulder pulse signal to the processor; and the high-frequency pulse signal extraction circuit is respectively connected to the square shoulder pulse signal extraction circuit and the processor and is configured to convert the current sine wave signal into the current high-frequency pulse signal and then output the current high-frequency pulse signal to the processor.

Further, the square shoulder pulse signal extraction circuit includes a current differential amplification circuit, an automatic gain amplification circuit, a current positive square wave generation circuit, a current negative square wave generation circuit, a square shoulder pulse generation circuit, and a first current shaping circuit; the current differential amplification circuit is respectively connected to the current signal input circuit, the processor and the automatic gain amplification circuit and is configured to perform primary amplification processing on the current sampling signals and respectively output the processed current sine wave signal to the processor and the automatic gain amplification circuit; the automatic gain amplification circuit is respectively connected to the processor, the current positive square wave generation circuit and the current negative square wave generation circuit and is configured to perform, under the control of the processor, secondary amplification processing on the current sine wave signal subjected to the primary amplification processing and output the current sine wave signal subjected to the secondary amplification processing; the current positive square wave generation circuit is configured to convert the current sine wave signal subjected to the secondary amplification processing into a 5.5 V current positive square wave signal; the current negative square wave generation circuit is configured to convert the current sine wave signal subjected to the secondary amplification processing into a current negative square wave signal; the square shoulder pulse generation circuit is respectively connected to the current positive square wave generation circuit, the current negative square wave generation circuit and the processor and is configured to superpose the current positive square wave signal and the current negative square wave signal, extract the current square shoulder pulse signal and then output the current square shoulder pulse signal to the processor; and the first current shaping circuit is connected to the current positive square wave generation circuit and is configured to convert the 5.5 V current positive square wave signal output by the current positive square wave generation circuit into a 3.3 V current positive square wave signal and then output the 3.3 V current positive square wave signal to the processor.

Further, the current positive square wave generation circuit includes a capacitor C25, a resistor R48, a resistor R59, a positive square wave generator U2B, a resistor R55, and a resistor R56; the first end of the capacitor C25 and the forward-phase input end of the positive square wave generator U2B are both connected to the automatic gain amplification circuit; the second end of the resistor R48 is connected to the power conversion circuit, and the first end of the resistor R48 is respectively connected to the first end of the resistor R59 and the reversed-phase input end of the positive square wave generator U2B; the output end of the positive square wave generator U2B is respectively connected to the first end of the resistor R55, the first end of the resistor R56, and the first current shaping circuit; the second end of the resistor R59, the second end of the capacitor C25 and the second end of the resistor R55 arc all grounded; and the second end of the resistor R56 is connected to the square shoulder pulse generation circuit.

Further, the current negative square wave generation circuit includes a resistor R49, a resistor R60, a negative square wave generator U2C, a capacitor C23, a capacitor C27, and a resistor R58; the reversed-phase input end of the negative square wave generator U2C is connected to the automatic gain amplification circuit, and the forward-phase input end thereof is respectively connected to the first end of the resistor R49 and the first end of the resistor R60; the second end of the resistor R49, the first end of the capacitor C23 and a fourth pin of the negative square wave generator U2C are all connected to the power conversion circuit; an eleventh pin of the negative square wave generator U2C and the first end of the capacitor C27 are connected to the power conversion circuit; the output end of the negative square wave generator U2C is respectively connected to the first end of the resistor R58 and the first current shaping circuit; and the second end of the resistor R58, the second end of the capacitor C23, the second end of the capacitor C27 and the second end of the resistor R60 are all grounded.

Further, the square shoulder pulse generation circuit includes a resistor R53, a capacitor C24, a NAND gate U3D, a capacitor C26, and a resistor R50; the first end of the resistor R53 is connected to the output end of the current negative square wave generation circuit, and the second end of the resistor R53 is respectively connected to the first end of the capacitor C24 and the first input end of the NAND gate U3D; the second input end of the NAND gale U3D is respectively connected to the output end of the current positive square wave generation circuit and the first end of the capacitor C26; the output end of the NAND gate U3D is respectively connected to the processor and the second end of the resistor R50; the first end of the resistor R50 is connected to the power conversion circuit; and the second end of the capacitor C24 and the second end of the capacitor C26 are both grounded.

Further, the voltage signal processing circuit includes a voltage differential amplification circuit and a voltage shaping circuit; the voltage differential amplification circuit is respectively connected to the power conversion circuit, the voltage shaping circuit and the processor and is configured to perform primary amplification processing on the voltage sampling signals and respectively output the processed voltage sine wave signal to the voltage shaping circuit and the processor, and the voltage shaping circuit is respectively connected to the voltage differential amplification circuit and the processor and is configured to sequentially perform secondary amplification processing and shaping processing on the voltage sine wave signal subjected to the primary amplification processing to convert the voltage sine wave signal into a voltage square wave signal and then output the voltage square wave signal to the processor.

Further, the voltage differential amplification circuit includes a resistor R14, a resistor R16, a resistor R13, a capacitor C20, a resistor R22, a differential amplifier U1D, a resistor R19, a resistor R20, and a capacitor C19; the first ends of the resistor R14 and the resistor R16 are connected to the power conversion circuit so that the voltage sampling signals are accessed; the first end of the capacitor C20 is connected to the power conversion circuit so that power voltages are accessed; the second end of the resistor R14 is respectively connected to the first end of the resistor R13 and the reversed-phase input end of the differential amplifier U1D; the second end of the capacitor C20 is connected to the first end of the resistor R22; the second end of the resistor R16 is respectively connected to the second end of the resistor R22 and the forward-phase input end of the differential amplifier U1D; the output end of the differential amplifier U1D is respectively connected to the second end of the resistor R13, the first end of the capacitor C19, and the voltage shaping circuit; the second end of the capacitor C19 is respectively connected to the second end of the resistor R19, the first end of the resistor R20, and the processor; the first end of the resistor R19 is grounded; and the second end of the resistor R20 is connected to the power conversion circuit.

Further, the voltage shaping circuit includes a resistor R18, a differential amplifier U1C, a resistor R17, a capacitor C18, a NAND gate U3A, and a resistor R12; the first end of the resistor R18 is connected to the output end of the voltage differential amplification circuit, and the second end thereof is connected to the forward-phase input end of the differential amplifier U1C; the reverse-phase input end of the differential amplifier U1C is grounded, and the output end thereof is connected to the first end of the resistor R17; the second end of the resistor R17 is respectively connected to the first end of the capacitor C18 and input ends of the NAND gate U3A; the second end of the capacitor C18 is grounded; the output end of the NAND gate U3A is respectively connected to the first end of the resistor R12 and the processor; and the second end of the resistor R12 is connected to the power conversion circuit.

The present disclosure has the following effects:

according to the single-phase fault arc detector provided by the present disclosure, the fault arc signal processing circuit processes the voltage sampling signals and the current sampling signals to obtain the voltage square wave signal, the voltage sine wave signal, the current sine wave signal, the current square wave signal, the current square shoulder pulse signal, and the current high-frequency pulse signal, and thus, the processor may accurately determine, on the basis of rite plurality of obtained current signals and voltage signals and in combination with a preset operation rule, whether there is a single-phase fault arc in a power utilization line. The current square shoulder pulse signal corresponds to square shoulder pans in a fault arc current waveform, correlated characteristics of the square shoulder parts may be accurately recognized by accurately extracting the current square shoulder pulse signal from the current sampling signals; then, characteristics such as tire number and durations of the square shoulder parts as well as current values may be comprehensively recognized on the basis of the current square shoulder pulse signal and the current High-frequency pulse signal; and when it is recognized that the number of the square shoulder pans exceeds 14, the duration of each square shoulder exceeds 420 us, and the current values exceed a rated current value by 5%, it is determined that there is the single-phase fault arc in the power utilization line, or else, it is determined that there is no single-phase fault arc in the power utilization line.

In addition to the objectives, characteristics and advantages described as above, the present disclosure also has other objectives, characteristics and advantages. The present disclosure will be further described in detail below with reference to the accompanying drawings.

BRIEF DESCRIPTION OF DRAWINGS

The accompanying drawings constituting one part of the present application are provided for further understanding of the present disclosure. Exemplary embodiments of the present disclosure and their descriptions are intended to explain the present disclosure, rather than to constitute improper limitations on the present disclosure. In the accompanying drawings.

Figure 1:
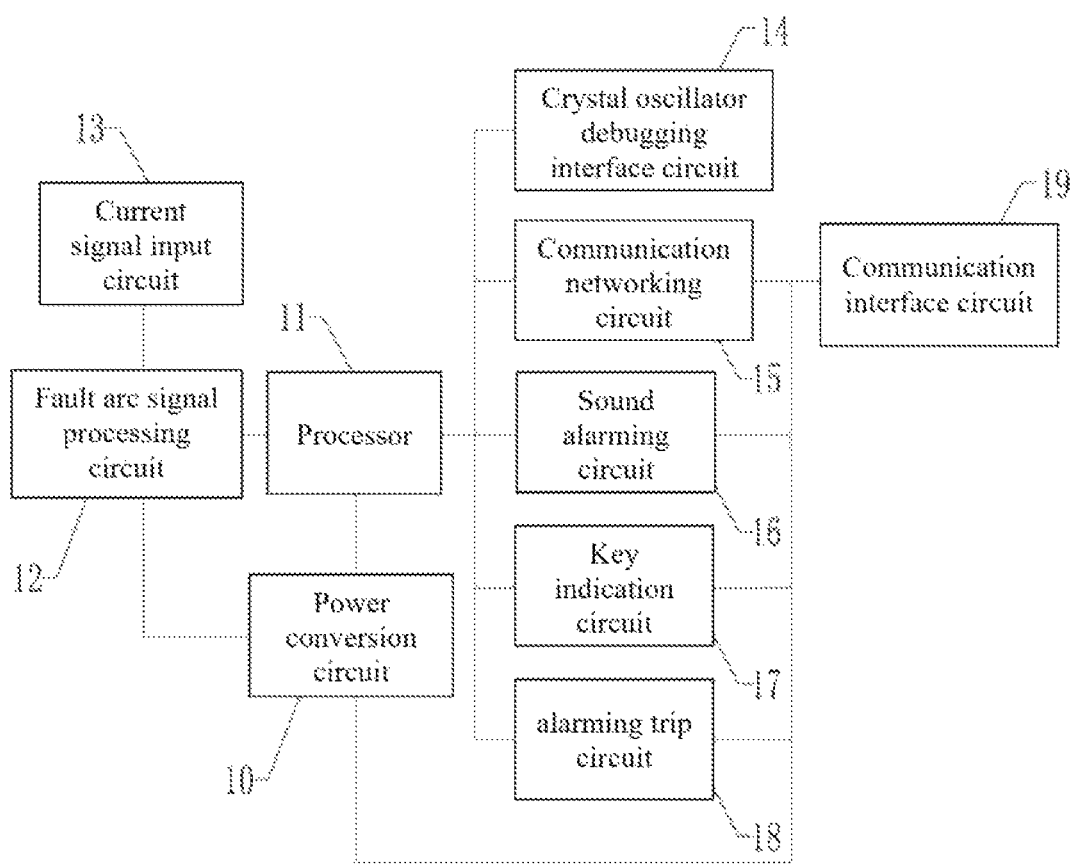
FIG. 1 is a schematic view showing a modular structure of a single-phase fault arc detector in a preferred embodiment of the present disclosure.

DESCRIPTIONS FOR REFERENCE NUMERALS IN THE ACCOMPANYING DRAWINGS 10, power conversion circuit; 11, processor; 12, fault arc signal processing circuit; 13, current signal input circuit; 14, crystal oscillator debugging interface circuit; 15, communication networking circuit; 16, sound alarming circuit; 17, key indication circuit; 18, alarming trip circuit; 19, communication interface circuit; 101, voltage sampling circuit; 102, first voltage conversion circuit; 103, second voltage conversion circuit; 104, third voltage conversion circuit; 105, fourth voltage conversion circuit; 121, voltage signal processing circuit; 122, current signal processing circuit; 123, square shoulder pulse signal extraction circuit; 124, high-frequency pulse signal extraction circuit; 1231, current differential amplification circuit; 1232, automatic gain amplification circuit; 1233, current positive square wave generation circuit; 1234, current negative square wave generation circuit; 1235, square shoulder pulse generation circuit; 1236, first current shaping circuit; 1211, voltage differential amplification circuit; 1212, voltage shaping circuit; 1241, high-pass filter circuit; 1242, low-pass filter circuit; and 1243, second current shaping circuit.

DETAILED DESCRIPTION OF THE EMBODIMENTS

Embodiments of the present disclosure will be described in detail below in combination with the accompanying drawings, however, the present disclosure may be implemented in various different manners limited and covered as follows.

As shown in FIG. 1, a preferred embodiment of the present disclosure provides a single phase fault arc detector used to detect a single-phase fault arc, including:

a power conversion circuit 10 connected to the live wire and neutral wire of a mains supply and configured to provide various power voltages and voltage sampling signals;

a current signal input circuit 13 connected to a current transformer and configured to provide current sampling signals;

a fault are signal processing circuit 12 respectively connected to the power conversion circuit 10 and the current signal input circuit 13 and configured to process the voltage sampling signals and the current sampling signals anti then output a voltage square wave signal, a voltage sine wave signal, a current sine wave signal, a current square wave signal, a current square shoulder pulse signal, and a current high-frequency pulse signal; and a processor 11 respectively connected to the power conversion circuit 10 and the fault arc signal processing circuit 12 and configured to determine, on the basis of the plurality of current signals and voltage signals output by the fault arc signal processing circuit 12 and in combination with a preset operation rule, whether there is a single-phase fault arc.

Figure 2:
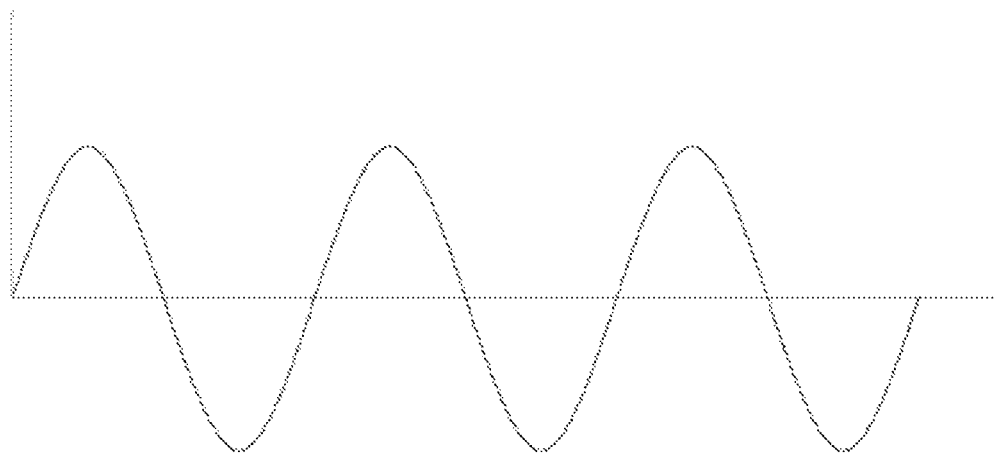
FIG. 2 is a schematic view showing a normal current waveform.
Figure 3:
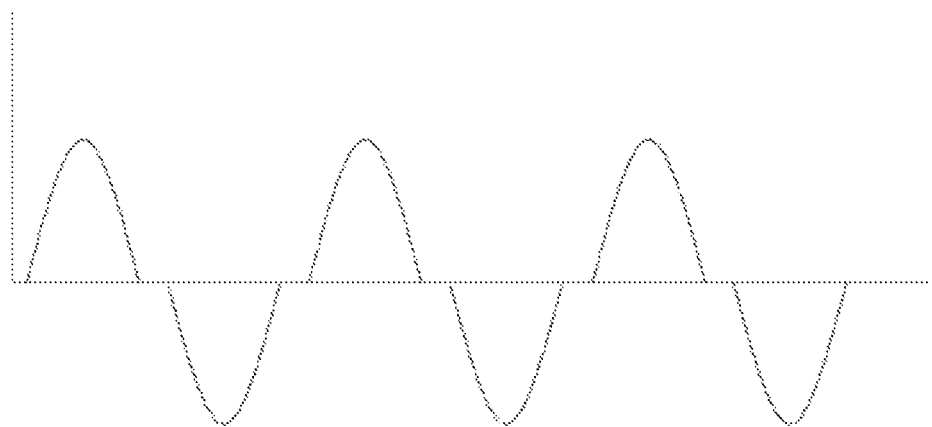
FIG. 3 is a schematic view showing a fault arc current waveform.

It can be understood that, as shown in FIG. 2 and FIG. 3, FIG. 2 is a normal current waveform, FIG. 3 is a fault arc current waveform. It can be seen from the contrast of the waveforms in FIG. 2 and FIG. 3, a fault arc current generally has the following characteristics: 1, there is a "zero current" phenomenon in the fault arc current every half a cycle, that is, there are square shoulder parts in the fault arc current waveform; 2, the rise rate of the fault arc current is generally higher than dial of a normal current, and the current may be abruptly changed every half a cycle, wherein the abrupt change is random, etc. The fault arc detection standard is clearly recorded in the national standard "GB14287.4-2014", effective detection may be achieved if only at most 9 or fewer fault arcs having half a cycle or 14 or more fault arcs having half a cycle are generated every second during detection, and microarcs of which the durations do not exceed 0.42 ms or the current values do not exceed 5% of a rated current value are not used as arcs for statistics. Therefore, accurate extraction for the square shoulder parts in the fault arc current waveform is of great importance to the detection of fault arcs.

It can be understood that, according to the single-phase fault arc detector in the present embodiment, the fault are signal processing circuit 12 processes the voltage sampling signals and the current sampling signals to obtain the voltage square wave signal, the voltage sine wave signal the current sine wave signal, the current square wave signal, the current square shoulder pulse signal, and the current high-frequency pulse signal, and thus, the processor 11 may accurately determine, on the basis of the plurality of obtained current signals and voltage signals and in combination with a preset operation rule, whether there is a single-phase fault arc in a power utilization line. The current square shoulder pulse signal corresponds to square shoulder parts in the fault arc current waveform, correlated characteristics of the square shoulder parts may be accurately recognized by accurately extracting the current square shoulder pulse signal from the current sampling signals; then, characteristics such as the number and durations of the square shoulder pans as well as a current value may be comprehensively recognized on the basis of the current square shoulder pulse signal and the current high-frequency pulse signal; and when it is recognized that the number of the square shoulder parts exceeds 14, the duration of each square shoulder exceeds 420 us, and the current value exceeds a rated current value by 5%, it is determined that there is the single-phase fault arc in the power utilization line, or else, it is determined that there is no single-phase fault arc in the power utilization line. At most time, the voltage square wave signal, the current square wave signal, the voltage sine wave signal and the current sine wave signal are used as triggering signals, and when it is recognized by the processor 11 that these signals are abnormal, a fault arc detection function is started, that is, the current square shoulder pulse signal and the current high-frequency pulse signal are started to be sampled, and thus, the accuracy of the detector is improved to reduce the false alarm rate while the flexibility of the detector is guaranteed. It can be understood that a specific determination rule is carried in the processor in advance by a program, and the processor may automatically determine whether there is the single-phase fault arc by only acquiring the above-mentioned current signals and voltage signals.

Figure 4:
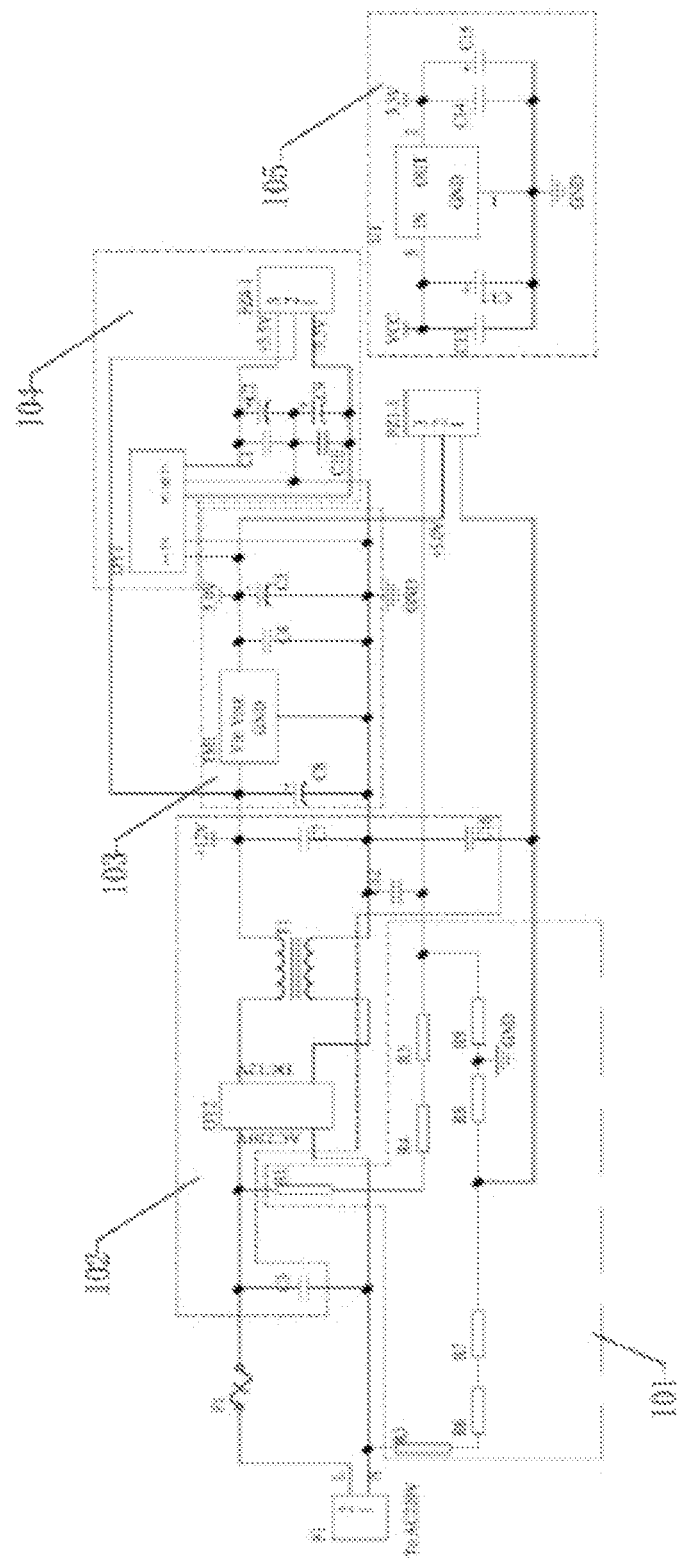
FIG. 4 is a schematic view showing a specific circuit structure of a power conversion circuit in FIG. 1.

It can be understood that, as shown in FIG. 4, the power conversion circuit 10 includes a fuse F1, a voltage sampling circuit 101, a first voltage conversion circuit 102, a second voltage conversion circuit 103, a third voltage conversion circuit 104, and a fourth voltage conversion circuit 105; the voltage sampling circuit 101 and the first voltage conversion circuit 102 are respectively connected to the live w ire and neutral wire of the mains supply; the fuse F1 is located between the first voltage conversion circuit 102 and the live wire of the mains supply and is configured to play a role in overload protection; the voltage sampling circuit 101 is configured to sample a voltage signal of the mains supply; the first voltage conversion circuit 102 is configured to convert a 220 V alternating current voltage of the mains supply into a +12 V direct current voltage; the second voltage conversion circuit 103 is connected to the output end of the first voltage conversion circuit 102 and is configured to convert the +12 V direct current voltage into a +5 V direct current voltage; the third voltage conversion circuit 104 is connected to the output end of the second voltage conversion circuit 103 and is configured to convert the +5 V direct current voltage into a ±5.5 V direct current voltage; and the fourth voltage conversion circuit 105 is connected to the output end of the second voltage conversion circuit 103 and is configured to convert the +5 V direct current voltage into a +3.3 V direct current voltage. It can be understood that the power conversion circuit 10 may be provided with more voltage conversion circuits as actually required to provide different power voltages.

Specifically, the voltage sampling circuit 101 includes a resistor R1, a resistor R2, a resistor R4, a resistor R5, a resistor R6, a resistor R7, a resistor R8, and a resistor R9; the first end of the resistor R1 is connected to the live wire of the mains supply by the fuse F1, and the second end of the resistor R1 is connected to the first end of the resistor R4; the second end of the resistor R4 is connected to the first end of the resistor R5; the first end of the resistor R3 is connected to the neutral wire of the mains supply, and the second end of the resistor R3 is connected to the first end of the resistor R6; the second end of the resistor R6 is connected to the first end of the resistor R7; the second end of the resistor R7 is respectively connected to the first end of the resistor R8 and the fault arc signal processing circuit 12; the second end of the resistor R8 and the first end of the resistor R9 are grounded; and the second end of the resistor R9 and the second end of the resistor R5 are both connected to the fault arc signal processing circuit 12. The voltage sampling circuit 101 may provide a voltage sampling signal to the fault arc signal processing circuit 12 in a resistive subdivision sampling manner, thereby facilitating subsequent voltage signal analysis.

The first voltage conversion circuit 102 includes a capacitor C3, a first voltage conversion module DY2, a filter inductor T1, a capacitor C7, a capacitor C12, and a capacitor C16; the first end of the capacitor C3 is connected to the live wire of the mains supply by the fuse F1, and the second thereof is connected to the neutral wire of the mains supply; two input ends of the first voltage conversion module DY2 are respectively connected to the live wire and neutral wire of the mains supply, and two output ends of the first voltage conversion module DY2 are respectively connected to the input end of the filter inductor T1; the first output end of the filter inductor T1 is respectively connected to the first end of the capacitor C7 and the second voltage conversion circuit 103, and the second output end thereof is grounded; the second end of the capacitor C12 is connected to the second end of the resistor R5; the second end of the capacitor C7, the first end of the capacitor C16 and the first end of the capacitor C12 are all grounded; and the second end of the capacitor C16 is connected to the second end of the resistor R7. The first voltage conversion module DY2 is an EMC power conversion module for converting an alternating current to a direct current; and by using the first voltage conversion module DY2, a 220 V alternating current power voltage of the mains supply is converted into a 12 V direct current power voltage.

The second voltage conversion circuit 103 includes a polar capacitor C8, a second voltage conversion module TM1, a capacitor C4, and a polar capacitor C5; the anode end of the polar capacitor C8 and fie input end of the second voltage conversion module TM1 are both connected to the first output end of the filter inductor T1; the output end of the second voltage conversion module TM1 is respectively connected to the first end of the capacitor C4, the anode end of the polar inductor C5, the fault arc signal processing circuit 12, and the third voltage conversion circuit 104; and the second end of the capacitor C4, the cathode end of the polar capacitor C5 and the cathode end of the polar capacitor C8 are all grounded. By using the second voltage conversion module TM1, a 12 V direct current voltage may be converted into a 5 V direct current voltage.

The third voltage conversion circuit 104 includes a third voltage conversion module DY1, a capacitor C1, a capacitor C2, and a polar capacitor C9; a first pin of the third voltage conversion module DY1 is connected to the output end of the second voltage conversion module TM1, a second pin thereof is grounded, a fifth pin thereof is used as the output end of a −5.5 V voltage, a sixth pin thereof is grounded, and a seventh pin thereof is respectively connected to the first end of the capacitor C1 and the anode end of the polar capacitor C2 and is used as the output end of a +5.5 V voltage; the second end of the capacitor C1, the cathode end of the polar capacitor C2, the first end of the capacitor C10 and the anode end of the polar capacitor C9 are all grounded; and the second end of the capacitor C10 and the cathode end of the polar capacitor C9 are both connected to the fifth pin of the third voltage conversion module DY1.

The fourth voltage conversion circuit 105 includes a capacitor C13, a polar capacity C17, a fourth voltage conversion module U1, a capacitor C14, and a polar capacitor C15; the first end of the capacitor C13, the anode end of the polar capacitor C17, the anode end of the polar capacity C7 and the input end of the fourth voltage conversion module U1 are all connected to the output end of the second voltage conversion module TM1; the output end of the fourth voltage conversion module U1 is respectively connected to the first end of the capacitor C14 and the anode end of the polar capacitor C15; and the second end of the capacitor C13, the cathode end of the polar capacitor C17, the second end of the capacitor C14 and the cathode end of the polar capacitor C15 are all grounded. By using the fourth voltage conversion module U1, a 5 V direct current voltage may be converted into a 3.3 V voltage by which the processor 11 may be powered.

Figure 5:
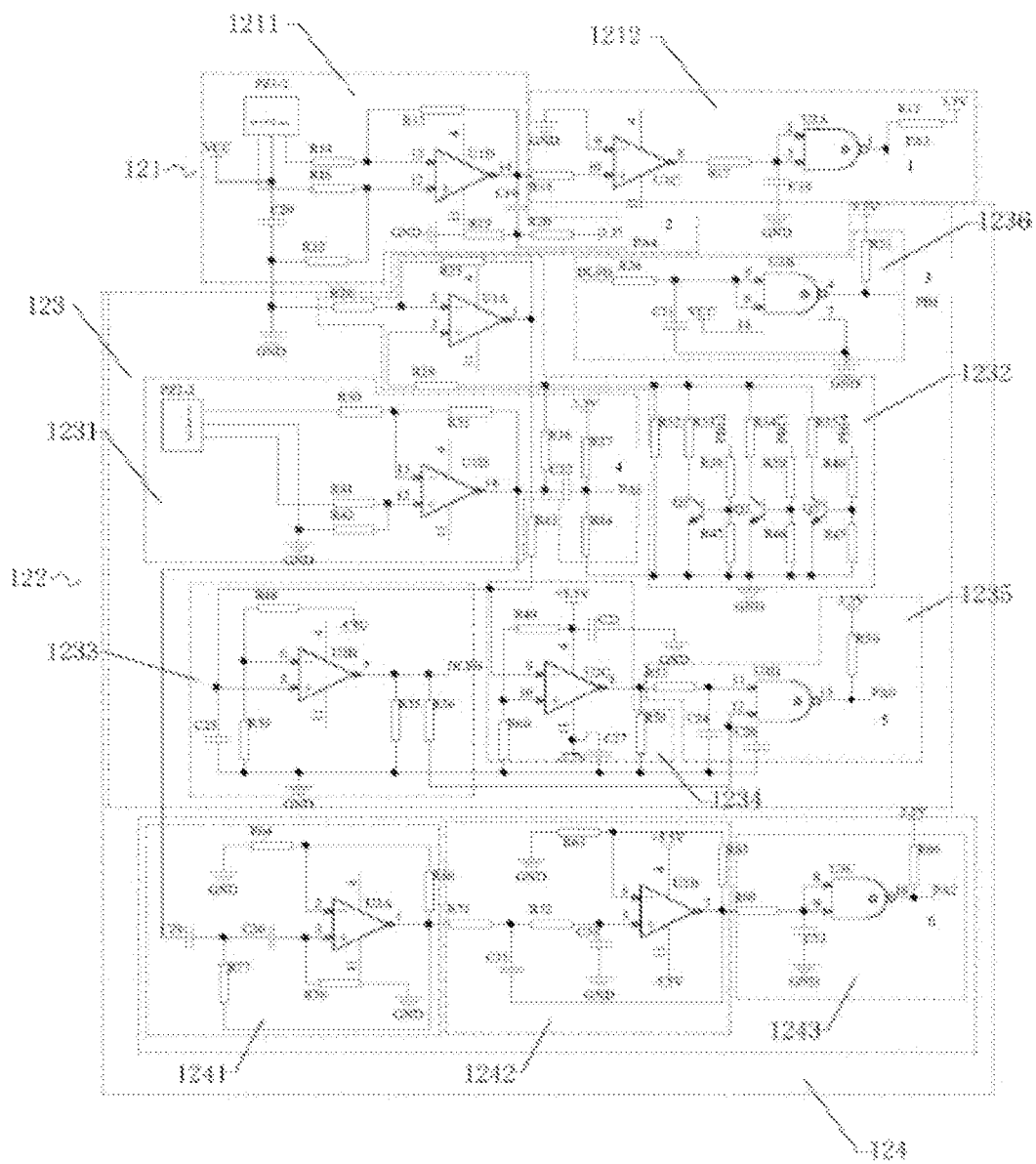
FIG. 5 is a schematic view showing a specific circuit structure of a fault arc signal processing circuit in FIG. 1.

It can be understood that, as shown in FIG. 1 and FIG. 5, the fault arc signal processing circuit 12 includes a voltage signal processing circuit 121 and a current signal processing circuit 122; the voltage signal processing circuit 121 is respectively connected to the power conversion circuit 10 and the processor 11 and is configured to respectively convert the voltage sampling signals into the voltage sine wave signal and the voltage square wave signal and then output the voltage sine wave signal and the voltage square wave signal to the processor 11; and the current signal processing circuit 122 is respectively connected to the current signal input circuit 13 and the processor 11 and is configured to respectively convert the current sampling signals into the current sine wave signal, the current square wave signal, the current square shoulder pulse signal and the current high-frequency pulse signal and then output the current sine wave signal, the current square wave signal, the current square shoulder pulse signal and the current high-frequency pulse signal to the processor 11.

Specifically, the voltage signal processing circuit 121 includes a voltage differential amplification circuit 1211 and a voltage shaping circuit 1212; the voltage differential amplification circuit 1211 is respectively connected to the power conversion circuit 10, the voltage shaping circuit 1212 and the processor 11 and is configured to perform primary amplification processing on the voltage sampling signals and respectively output the voltage sine wave signal subjected to the amplification process to the voltage shaping circuit 1212 and the processor 11; and the voltage shaping circuit 1212 is respectively connected to the voltage differential amplification circuit 1211 and the processor 11 and is configured to sequentially perform secondary amplification processing and shaping processing on the voltage sine wave signal subjected to the primary amplification processing to convert the voltage sine wave signal into a 3.3 V voltage square wave signal and then output the 3.3 V voltage square wave signal to the processor 11. The processor 11 may recognize the correlated characteristics of the fault arc voltage signal according to the voltage sine wave signal and the voltage square wave signal, for example, when the single-phase fault arc occurs, a line voltage sags, the waveform is approximately rectangular, and therefore, the processor 11 may preliminarily determine, according to the voltage sine wave signal and the voltage square wave signal, whether there is the single-phase fault arc.

Specifically, the voltage differential amplification circuit 1211 includes a resistor R14, a resistor R16, a resistor R13, a capacitor C20, a resistor R22, a differential amplifier U1D, a resistor R19, a resistor R20, and a capacitor C19; the first ends of the resistor R14 and the resistor R16 are connected to the power conversion circuit 10 so that the voltage sampling signals are accessed, that is, they are connected to the output end of the voltage sampling circuit 101; the first end of the capacitor C20 is connected to the power conversion circuit 10 so that a 5 V power voltage is accessed; the second end of the resistor R14 is respectively connected to the first end of the resistor R13 and the reversed-phase input end of the differential amplifier U1D; the second end of the capacitor C20 is connected to the first end of the resistor R22; the second end of tire resistor R16 is respectively connected to the second end of the resistor R22 and the forward-phase input end of the differential amplifier U1D; the output end of the differential amplifier U1D is respectively connected to the second end of the resistor R13, the first end of the capacitor C19, and the voltage shaping circuit 1212; the second end of the capacitor C19 is respectively connected to the second end of the resistor R19, the first end of the resistor R20, and the processor 11; the first end of the resistor R19 is grounded; and the second end of the resistor R20 is connected to the power conversion circuit 10 so that a 3.3 V power voltage is accessed.

The voltage shaping circuit 1212 includes a resistor R18, a differential amplifier U1C, a resistor R17, a capacitor C18, a NAND gate U3A, and a resistor R12; the first end of the resistor R18 is connected to the output end of the voltage differential amplification circuit 1211, i.e. the output end of the differential amplifier U1D, and the second end of the resistor R18 is connected to the forward-phase input end of the differential amplifier U1C; the reverse-phase input end of the differential amplifier U1C is grounded, and the output end thereof is connected to the first end of the resistor R17; the second end of the resistor R17 is respectively connected to the first end of the capacitor C18 and two input ends of the NAND gate U3A; the second end of the capacitor C18 is grounded; the output end of the NAND gate U3A is respectively connected to the first end of the resistor R12 and the processor 11; and the second end of the resistor R12 is connected to the power conversion circuit 10. The secondary amplification is performed on the voltage sine wave signal by the differential amplifier U1C, and then, the voltage sine wave signal subjected to the secondary amplification is shaped by using the NAND gate U3A so as to be converted into a 3.3 V voltage square wave signal to be conveniently recognized and processed by the processor 11.

The current signal processing circuit 122 includes a square shoulder pulse signal extraction circuit 123 and a high-frequency pulse signal extraction circuit 124; the square shoulder pulse signal extraction circuit 123 is respectively connected to the current signal input circuit 13 and the processor 11 and is configured to respectively convert the current sampling signals into the current sine wave signal, the current square wave signal and the current square shoulder pulse signal and then output the current sine wave signal, the current square wave signal and the current square shoulder pulse signal to the processor 11; and the high-frequency pulse signal extraction circuit 124 is respectively connected to the square shoulder pulse signal extraction circuit 123 and the processor 11 and is configured to convert the current sine wave signal into tire current high-frequency pulse signal and then output the current high-frequency pulse signal to the processor 11.

Specifically, the square shoulder pulse signal extraction circuit 123 includes a current differential amplification circuit 1231, an automatic gain amplification circuit 1232, a current positive square wave generation circuit 1233, a current negative square wave generation circuit 1234, a square shoulder pulse generation circuit 1235, and a first current shaping circuit 1236; the current differential amplification circuit 1231 is respectively connected to the current signal input circuit 13, the processor 11 and the automatic gain amplification circuit 1232 and is configured to perform primary amplification processing on the current sampling signals and respectively output the current sine wave signal subjected to amplification processing to the processor 11 and the automatic gain amplification circuit 1232; the automatic gain amplification circuit 1232 is respectively connected to the processor 11, the current positive square wave generation circuit 1233 and the current negative square wave generation circuit 1234 and is configured to perform, under the control of the processor 11, secondary amplification processing on the current sine wave signal subjected to the primary amplification processing and output the current sine wave signal subjected to the secondary amplification processing, the current positive square wave generation circuit 1233 is configured to convert the current sine wave signal subjected to the secondary amplification processing into a 5.5 V current positive square wave signal; the current negative square wave generation circuit 1234 is configured to convert the current sine wave signal subjected to the secondary amplification processing into a current negative square wave signal; the square shoulder pulse generation circuit 1235 is respectively connected to the current positive square wave generation circuit 1233, the current negative square wave generation circuit 1234 and the processor 11 and is configured to superpose the current positive square wave signal and the current negative square wave signal, extract the current square shoulder pulse signal and then output the current square shoulder pulse signal to the processor 11, and the first current shaping circuit 1236 is connected to the current positive square wave generation circuit 1233 and is configured to convert the 5.5 V current positive square wave signal output by the current positive square wave generation circuit 1233 into a 3.3 V current positive square wave signal and then output the 3.3 V current positive square wave signal to the processor 11.

The current differential amplification circuit 1231 includes a resistor R30, a resistor R41, a resistor R42, a differential amplifier U1D, a resistor R31, a resistor R36, a resistor R37, a capacitor C22, and a resistor R44; the first end of the resistor R41 and the first end of the resistor R30 are both connected to the current signal input circuit 13, and the second end of the resistor R30 is respectively connected to the first end of the resistor R31 and the reversed-phase input end of the differential amplifier U1D; the second end of the resistor R41 and the second end of the resistor R42 are both connected to the in-phase input end of the differential amplifier U1D; the first end of the resistor R42 is grounded; the output end of the differential amplifier U1D is respectively connected to the second end of the resistor R31, the first end of the capacitor C22, the second end of the resistor R36, and the high-frequency pulse signal extraction circuit 124; the first end of the resistor R36 is connected to the automatic gain amplification circuit 1232; the second end of the capacitor C22 is respectively connected to the second end of the resistor R37, the first end of the resistor R44, and the processor 11; the first end of the resistor R37 is connected to the power conversion circuit 10 so that a 3.3 V power voltage is accessed; and the second end of the resistor R44 is grounded.

The automatic gam amplification circuit 1232 includes a resistor R28, a resistor R23, a resistor 29, an in-phase amplifier U1A, a resistor R43, a resistor R32, a resistor R33, a resistor R34, a resistor R35, a resistor R38, a resistor R39, a resistor R40, a resistor R45, a resistor R46, a resistor R47, a triode Q1, a triode Q2, and a triode Q3; the first end of the resistor R28 is grounded, and the second end of the resistor R28 and the first end of the resistor R23 are connected to the reversed-phase input end of the in-phase amplifier U1A; the first end of the resistor R29 is connected to the forward-phase input end of the in-phase amplifier U1A; the output end of the in-phase amplifier U1A is respectively connected to the second end of the resistor R23 and the first end of the resistor R43; and the second end of the resistor R43 is respectively connected to the current positive square wave generation circuit 1233 and the current negative square wave generation circuit 1234. The second end of the resistor R29 is respectively connected to the first end of the resistor R36, the first end of the resistor R32, the first end of the resistor R33, the first end of the resistor R34, and the first end of the resistor R35; the second end of the resistor R33 is connected to the collector of the triode Q1, and the base of the triode Q1 is respectively connected to the second end of the resistor R38 and the first end of the resistor R45; the first end of the resistor R38, the first end of the resistor R39 and the first end of the resistor R40 are all connected to the processor 11; the collector of the triode Q2 is connected to the second end of the resistor R34, and the base thereof is respectively connected to the second end of the resistor R39 and the first end of the resistor R46; the collector of the triode Q3 is connected to the first end of the resistor R35, and the base thereof is respectively connected to the second end of the resistor R40 and the first end of the resistor R47; and the second end of the resistor R32, the emitter of the triode Q1, the emitter of the triode Q2, the emitter of the triode Q3, the second end of the resistor R45, the second end of the resistor R46 and the second end of the resistor R47 are all grounded. The processor 11 controls, by controlling electric levels applied to the resistor R38, the resistor R39 and the resistor R40, whether the triode Q1, the triode Q2 and the triode Q3 are turned on, thereby controlling the number of the resistors connected to the circuit and a connecting structure among the plurality of resistors to change the attenuation intensity of an input signal of the in-phase amplifier U1A and then achieve control on 8-level attenuation.

Figure 6:
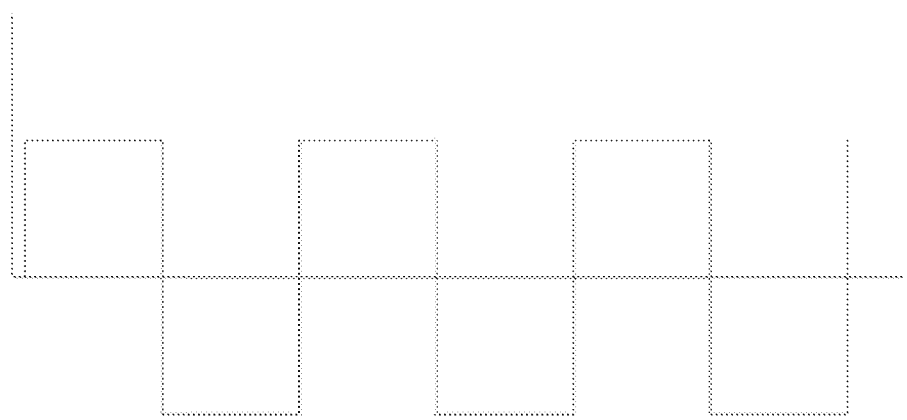
FIG. 6 is a schematic view showing a waveform of a fault arc current positive square wave signal generated by a current positive square wave generation circuit in a preferred embodiment of the present disclosure.

The current positive square wave generation circuit 1233 includes a capacitor C25, a resistor R48, a resistor R59, a positive square wave generator U2B, a resistor R55, and a resistor R56; the first end of the capacitor C25 and the forward-phase input end of the positive square wave generator U2B are both connected to the automatic gain amplification circuit 1232, i.e. The second end of the resistor R43, so that the current sine wave signal subjected to the amplification processing is accessed; the second end of the resistor R48 is connected to the power conversion circuit 10 so that a −5.5 V power voltage is accessed, and the first end of the resistor R48 is respectively connected to the first end of the resistor R59 and the reversed-phase input end of the positive square wave generator U2B, the output end of the positive square wave generator U2B is respectively connected to the first end of the resistor R55, the first end of the resistor R56, and the first current shaping circuit 1236; the second end of the resistor R59, the second end of the capacitor C25 and the second end of the resistor R55 are all grounded; and the second end of the resistor R56 is connected to the square shoulder pulse generation circuit 1235. A fault arc current positive square wave signal generated by the current positive square wave generation circuit 1233 is shown as FIG. 6.

Figure 7:
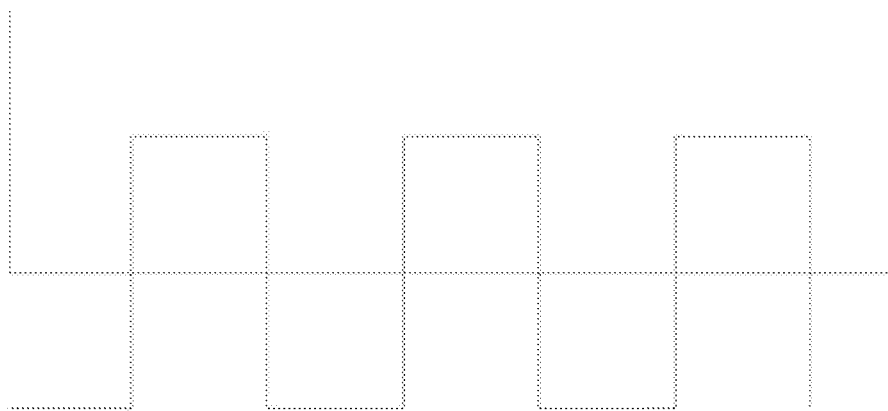
FIG. 7 is a schematic view showing a waveform of a fault arc current negative square wave signal generated by a current negative square wave generation circuit in a preferred embodiment of the present disclosure.

The current negative square wave generation circuit 1234 includes a resistor R49, a resistor R60, a negative square wave generator U2C, a capacitor C23, a capacitor C27, and a resistor R58; the reversed-phase input end of the negative square wave generator U2C is connected to the automatic gain amplification circuit 1232, i.e. the second end of the resistor R43, and the forward-phase input end thereof is respectively connected to the first end of the resistor R49 and the first end of the resistor R60; the second end of the resistor R49, the first end of the capacitor C23 and a fourth pin of the negative square wave generator U2C are all connected to the power conversion circuit 10 so that a +5.5 V power voltage is accessed; an eleventh pin of the negative square wave generator U2C and the first end of the capacitor C27 are connected to the power conversion circuit 10 so that a −5.5 V power voltage is accessed; the output end of the negative square wave generator U2C is respectively connected to the first end of the resistor R58 and the first current shaping circuit 1236; and the second end of the resistor R58, the second end of the capacitor C23, the second end of the capacitor C27 and the second end of the resistor R60 are all grounded. By using the current negative square wave generation circuit 1234. A fault arc current negative square wave signal generated by the current negative square wave generation circuit 1234 is shown as FIG. 7.

Figure 8:
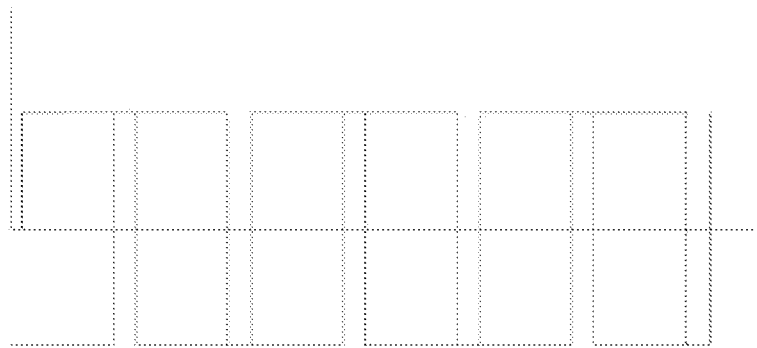
FIG. 8 is a schematic view showing that the fault arc current positive square wave signal and the fault arc current negative square wave signal are superposed by a square shoulder pulse generation circuit in a preferred embodiment of the present disclosure.
Figure 9:
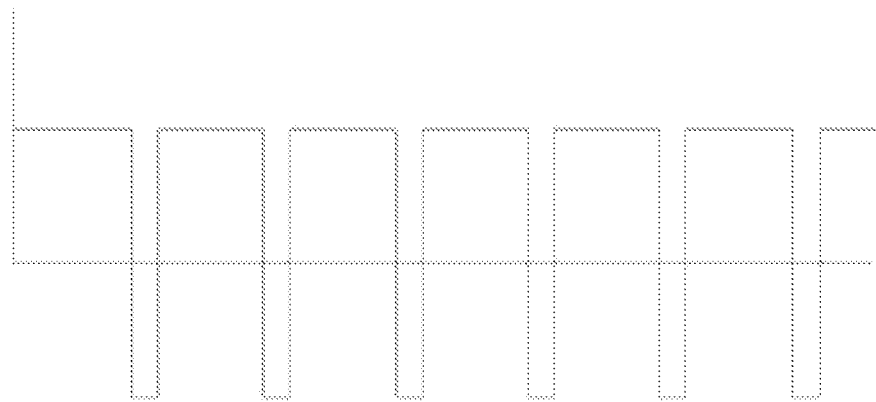
FIG. 9 is a schematic view showing a waveform of a square shoulder pulse reverse signal synthesized by the square shoulder pulse generation circuit in a preferred embodiment of the present disclosure.

The square shoulder pulse generation circuit 1235 includes a resistor R53, a capacitor C24, a capacitor C26, a NAND gate U3D, and a resistor R50; the first end of the resistor R53 is connected to the output end of the negative square wave generator U2C, and the second end of the resistor R53 is respectively connected to the first end of the capacitor C24 and the first input end of the NAND gate U3D; the second input end of the NAND gate U3D is respectively connected to the first end of the capacitor C26 and the output end of the current positive square wave generation circuit (i.e. the second end of the resistor R56); the output end of the NAND gate U3D is respectively connected to the processor (11) and the second end of the resistor R50; the first end of the resistor R50 is connected to the power conversion circuit 10 so that a 3.3 V power voltage is accessed; and the second end of the capacitor C24 and the second end of the capacitor C26 are grounded. As shown in FIG. 8 and FIG. 9, by using the NAND gate U3D, the fault arc current positive square wave signal and the fault arc current negative square wave signal are superposed, and a square shoulder pulse reverse waveform, i.e. the current square shoulder pulse signal, is extracted. FIG. 8 is a schematic view showing that the fault arc current positive square wave signal and the fault arc current negative square wave signal are superposed by the NAND gate U3D; and FIG. 9 is a schematic view showing a waveform of the square shoulder pulse reverse signal synthesized by the NAND gate U3D.

The first current shaping circuit 1236 includes a resistor R24, a capacitor C21, a NAND gate U3B, and a resistor R21; the first end of the first resistor R24 is connected to the output end of the positive square wave generator U2B, and the second end of the first resistor R24 is connected to connected to the first end of the capacitor C21 and the input end of the NAND gate U3B; the second end of the capacitor C21 is grounded; the output end of the NAND gate U3B is respectively connected to the processor 11 and the second end of the resistor R21; and the first end of the resistor R21 is connected to the power conversion circuit 10 so that a 3.3 V power voltage is accessed. By using the NAND gate U3B, a 5.5 V current positive square wave signal is converted into a 3.3 V current positive square wave signal, and then, the 3.3 V current positive square wave signal is output to the processor 11 so as to be conveniently recognized and processed by the processor 11. It can be understood that a current square wave signal output by the first current shaping circuit 1236 is a current positive square wave signal, i.e. a half-wave signal.

The high-frequency pulse signal extraction circuit 124 includes a high-pass filter circuit 1241, a low-pass filter circuit 1242 and a second current shaping circuit 1243; the high-pass filter circuit 1241 is connected to the current differential amplification circuit 1231; the low-pass filter circuit 1242 is respectively connected to the high-pass filter circuit 1241 and the second current shaping circuit 1243; the high-pass filter circuit 1241 is configured to filter a low-frequency interference signal in the current sine wave signal subjected to the amplification processing; the low-pass filter circuit 1242 is configured to filter a high-frequency interference signal in the current sine wave signal; a medium-frequency current sine wave signal may only enter the second current shaping circuit 1243 after being subjected to two-time band-pass filtering; and the second current shaping circuit 1243 is configured to shape the current sine wave signal into a 3.3 V current square wave signal and then output the 3.3 V current square wave signal to the processor 11. It can be understood that the current square wave signal output by the second current shaping circuit 1243 is a complete square wave signal. In a preferred embodiment of the present disclosure, the allowable critical signal frequency of the high-pass filter circuit 1241 is 700 kHz, that is, signals of which the frequencies exceed 700 kHz are only allowed to pass; the allowable critical signal frequency of the low-pass filter circuit 1242 is 900 kHz, that is, signals of which the frequencies are smaller than 900 kHz are only allowed to pass; and the frequency of the current sine wave signal is about 800 kHz.

Specifically, the high-pass filter circuit 1241 includes a capacitor C29, a resistor R77, a capacitor C30, a resistor R64, an operational amplifier U2A, a resistor R79, and a resistor R68; the first end of the capacitor 129 is connected to the output end of the current differential amplification circuit 1231, i.e. the output end of the differential amplifier U1D, and the second end of the capacitor C29 is respectively connected to the first end of the capacitor C30 and the first end of the resistor R77; the second end of the capacitor C30 is respectively connected to the first end of the resistor R79 and the forward-phase input end of the operational amplifier U2A; the second end of the resistor R79 and the first end of the resistor R64 are grounded; the reversed-phase input end of the operational amplifier U2A is respectively connected to the second end of the resistor R64 and the first end of the resistor R68; and the output end of the operational amplifier U2A is respectively connected to the second end of the resistor R68, the second end of the resistor R77, and the low-pass filter circuit 1242.

The low-pass filter circuit 1242 includes a resistor R71, a capacitor C33, a resistor R72, a capacitor C31, an operational amplifier U2B, a resistor R63, and a resistor R65; the first end of the resistor R71 is connected to the output end of the high-pass filter circuit 1241, i.e. the output end of the operational amplifier U2A, and the second end of the resistor R71 is respectively connected to the first end of the capacitor C33 and the first end of the resistor R72; the second end of the resistor R72 is respectively connected to the first end of the capacitor C31 and the forward-phase input end of the operational amplifier U2B; the reversed-phase input end of the operational amplifier U2B is respectively connected to the second end of the resistor R63 and the first end of the resistor R65; the first end of the resistor R63 and the second end of the capacitor C31 are grounded; and the output end of the operational amplifier U2B is respectively connected to the second end of the capacitor C33, the second end of the resistor R65, and the second current shaping circuit 1243.

Figure 10:
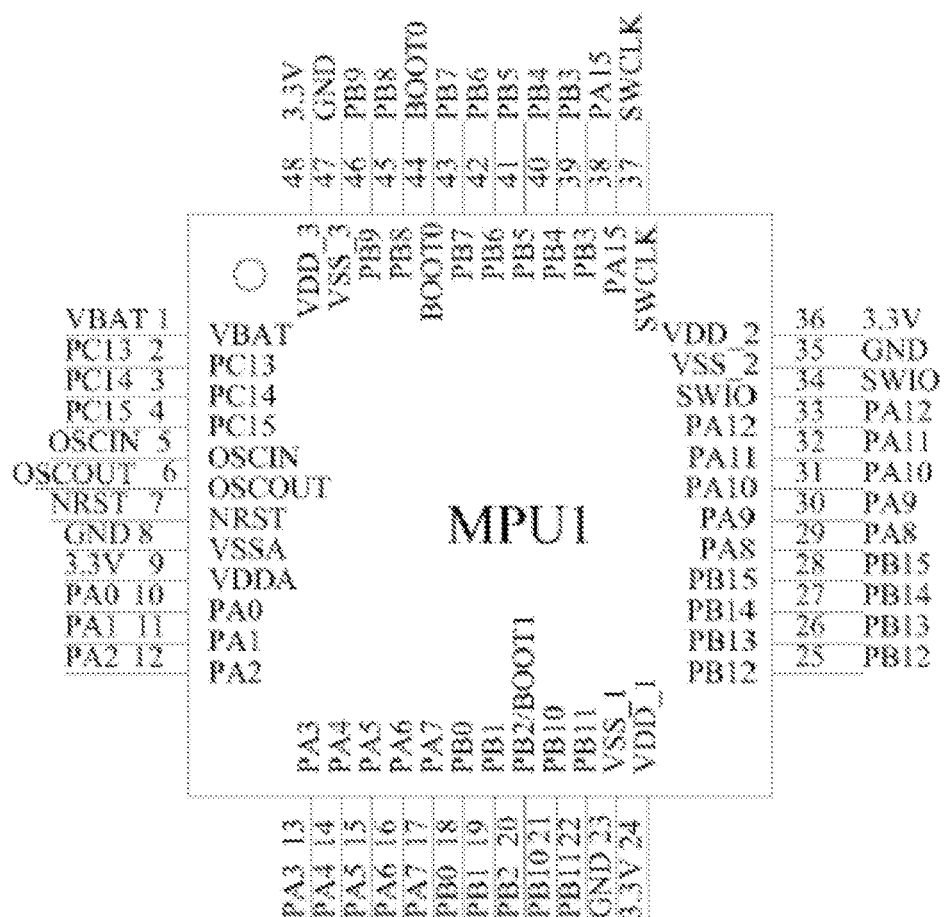
FIG. 10 is a schematic view showing pin layout of a processor in FIG. 1.

The second current shaping circuit 1243 includes a resistor R69, a capacitor C32, a NAND gate U3C, and a resistor R66; the first end of the resistor R69 is connected to the output end of the low-pass filter circuit 1242, i.e. the output end of the operational amplifier U2B, and the second end of the resistor R69 is respectively connected to the first end of the capacitor C32 and the input end of the NAND gate U3C; the second end of the capacitor C32 is grounded; the output end of the NAND gate U3C is respectively connected to the second end of the resistor R66 and the processor 11; and the first end of the resistor R66 is connected to the power conversion circuit 10 so that a 3.3 V power voltage may be accessed. By using the NAND gate U3C, a current sine wave signal subjected to second-level band-pass filtering is shaped to form a 3.3 V complete current square wave signal to be conveniently recognized and processed by the processor 11. In addition, a circuit pin view of the processor 11 is shown as FIG. 10, and there are 48 pins in total.

Figure 11:
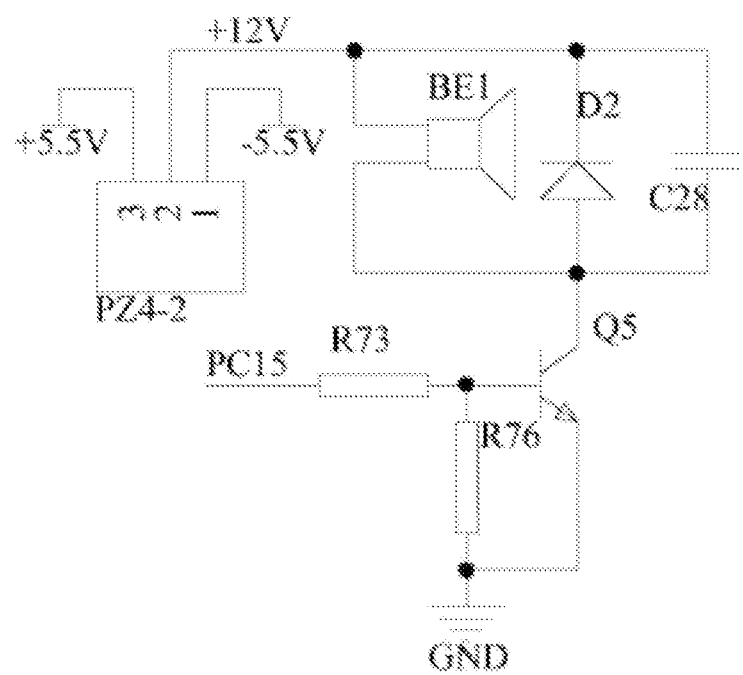
FIG. 11 is a schematic view showing a specific circuit structure of a sound alarming circuit in FIG. 1.

It can be understood that, as a preference, as shown in FIG. 1 and FIG. 11, the single-phase fault arc detector further includes a sound alarming circuit 16 connected to the processor 11 and configured to give a sound alarming caution. When determining that there is a single-phase fault arc in a power utilization line, the processor 11 controls the sound alarming circuit 16 to give an alarming caution. Specifically, the sound alarming circuit 16 includes a buzzer BE1, a diode D2, a capacitor C28, a resistor R73, a resistor R76, and a triode Q5; the first end of the resistor R73 is connected to the processor 11 so that a control signal is accessed, and the second end of the resistor R73 is respectively connected to the first end of the resistor R76 and the base of the triode Q5; the second end of the resistor R76 and the emitter of the triode Q5 are grounded; the collector of the triode Q5 is respectively connected to the buzzer BE1, the anode end of the diode D2, and the second end of the capacitor C28; and the buzzer BE1, the cathode end of the diode D2 and the first end of the capacitor C28 are all connected to the power conversion circuit 10 so that a +12 V power voltage is accessed. The overall circuit is relatively simple in structure, adopts relatively common electronic elements in the market and lower in manufacturing cost.

Figure 12:
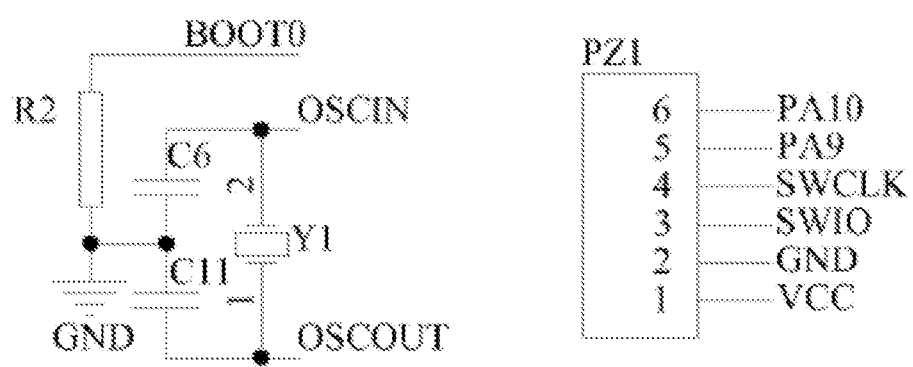
FIG. 12 is a schematic view showing a specific circuit structure of a crystal oscillator debugging interface circuit in FIG. 1.

It can be understood that, as a preference, as shown in FIG. 1 and FIG. 12, the single-phase fault arc detector further includes a crystal oscillator debugging interface circuit 14 connected to the processor 11. Specifically, the crystal oscillator debugging interface circuit 14 includes an interface PZ1, a resistor R2, a capacitor C6, a capacitor C11, and a crystal oscillator Y1; the interface PZ1, the first end of the resistor R2, the first end of the capacitor C6, two ends of the crystal oscillator Y1 and the second end of the capacitor C11 are all connected to the processor 11, and the second end of the resistor R2, the second end of the capacitor C6 and the first end of the capacitor C11 are all grounded. By connecting the PZ1 to external crystal oscillator debugging equipment, the working parameter of the crystal oscillator Y1 may be debugged.

Figure 13:
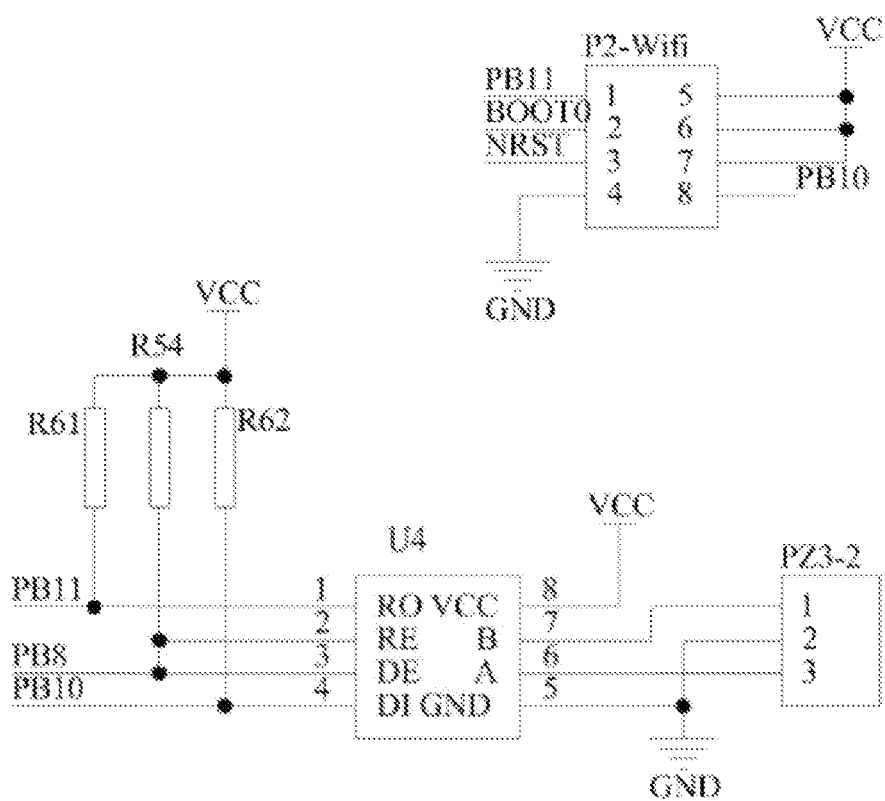
FIG. 13 is a schematic view showing a specific circuit structure of a communication networking circuit in FIG. 1.

It can be understood that, as a preference, as shown in FIG. 1 and FIG. 13, the single-phase fault arc defector further includes a communication networking circuit 15 connected to the processor 11. Specifically, the communication networking circuit 15 includes a Wifi interface module and a RS485 communication circuit respectively connected to the processor 11; the Wifi interface module is configured to perform communication on a Wifi signal; and the RS485 communication circuit is configured to perform communication on a 485 signal. The RS485 communication circuit includes a resistor R61, a resistor R54, a resistor R62, and a RS485 communication module U4; the first ends of the resistor R61, the resistor R54 and the resistor R62 are all connected to the power conversion circuit 10 so that a 5 V power voltage is accessed; the second end of the resistor R61, the second end of the resistor R54, the second end of the resistor R62 and the output end of the RS485 communication module U4 are all connected to the processor 11; and the input end of the RS485 communication module U4 is connected to external communication equipment by an interface.

Figure 14:
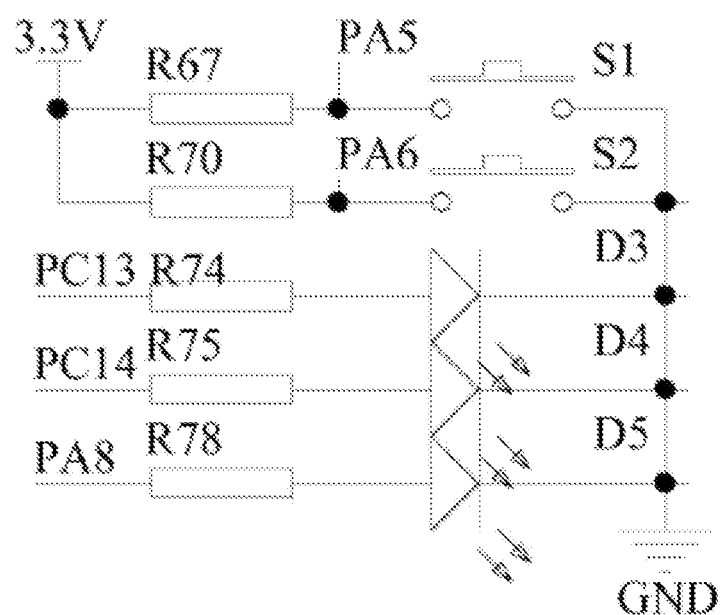
FIG. 14 is a schematic view showing a specific circuit structure of a key indication circuit in FIG. 1.

It can be understood that, as a preference, as shown in FIG. 1 and FIG. 14, the single-phase fault arc detector further includes a key indication circuit 17 connected to the processor 11. Specifically, the key indication circuit 17 includes a resistor R67, a resistor R70, a resistor R74, a resistor R75, a resistor R78, a key switch S1, a key switch S2, a light emitting diode D3, a light emitting diode D4, and a light emitting diode D5; the first end of the resistor R67 and the first end of the resistor R70 are both connected to the power conversion circuit 10 so that a 3.3 V power voltage is accessed; the second end of the resistor R67 is respectively connected to the processor 11 and the first end of the key switch S1; the second end of the resistor R70 is respectively connected to the processor 11 and the first end of the key switch S2; the first end of the resistor R74, the first end of the resistor R75 and the first end of the resistor R78 are all connected to the processor 11; the second end of the resistor R74 is connected to the first end of the light emitting diode D3; the second end of the resistor R75 is connected to the first end of the light emitting diode D4; the second end of the resistor R78 is connected to the first end of the light entitling diode D5; and the second end of the light emitting diode D3, the second end of the light emitting diode D4, the second end of the light emitting diode D5, the second end of the key switch S1 and the second end of the key switch S2 are all grounded.

Figure 15:
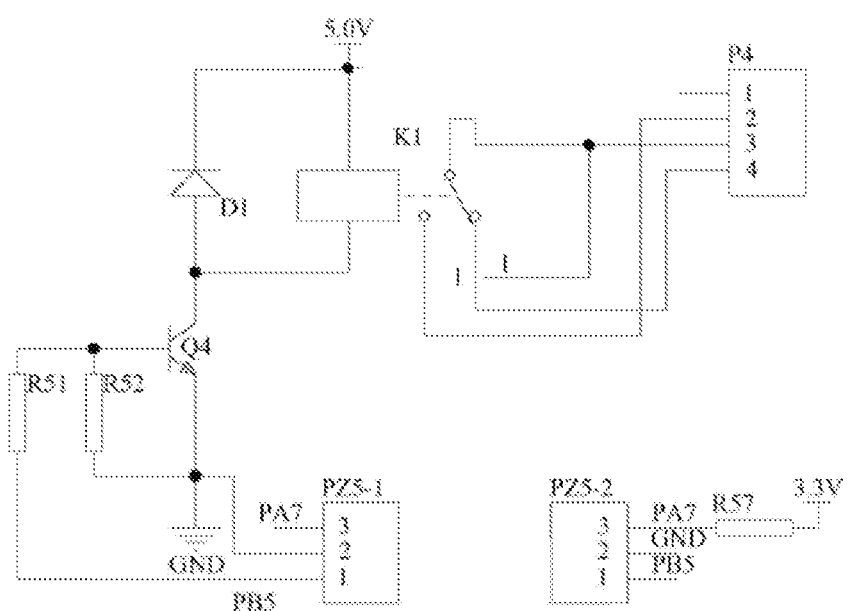
FIG. 15 is a schematic view showing a specific circuit structure of a alarming trip circuit in FIG. 1.

It can be understood that, as a preference, as shown in FIG. 1 and FIG. 15, the single-phase fault arc detector further includes an alarming trip circuit 18 connected to the processor 11 and configured to control the turn off of a safety switch in the power utilization line under the control of the processor 11 so as to play a role in safely protection. Specifically, the alarming trip circuit 18 includes a resistor R57, a resistor R51, a resistor R52, a triode Q4, a diode D1, and a relay K1; the first end of the resistor R57 is connected to the processor 11, and the second end of the resistor R57 is connected to the power conversion circuit 10 so that a 3.3 V power voltage is accessed; the second end of the resistor R51 is connected to the processor 11; the first end of the resistor R51 and the first end of the resistor R52 are both connected to the base of the triode Q4; the second end of the resistor R52 and the emitter of the triode Q4 are both grounded; the emitter of the triode Q4 is respectively connected to the anode end of the diode D1 and the relay K1; the relay K1 and the cathode end of the diode D1 are both connected to the power conversion circuit 10 so that a +5 V power voltage is accessed; and a normally-closed contact of the relay K1 is connected to the safety switch in the power utilization line. The processor 11 sends a control signal to control the triode Q4 to be turned on, thereby controlling the relay K1 to be electrified; and then, the relay K1 acts, thereby controlling the safety switch to be turned off.

Figure 16:
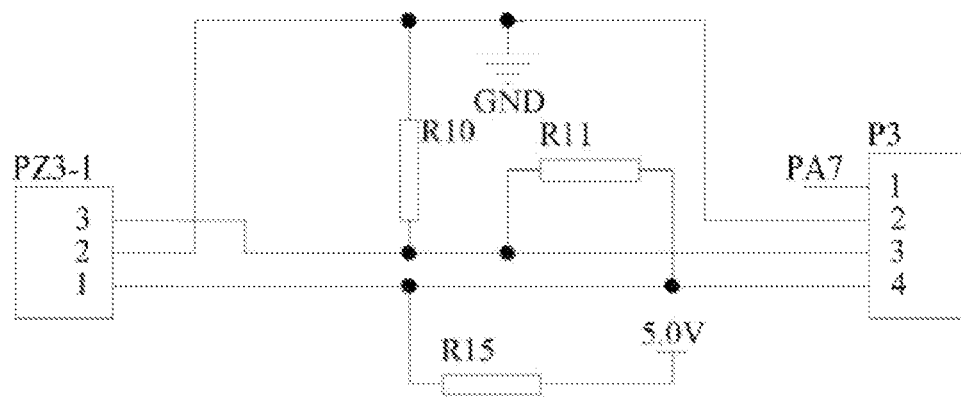
FIG. 16 is a schematic view showing a specific circuit structure of a communication interface circuit in FIG. 1.

It can be understood that, as a preference, as shown in FIG. 1 and FIG. 16, the single-phase fault arc detector further includes a communication interface circuit 19 connected to the communication networking circuit 15. The communication interface circuit 19 includes a resistor R10, a resistor R15, and a resistor R11; the first end of the resistor R10 is grounded; the second end of the resistor R10 and the first end of the resistor R11 are connected to the communication networking circuit 15; the second end of the resistor R11 and the first end of the resistor R15 are both connected to the communication networking circuit 15; and the second end of the resistor R15 is connected to the power conversion circuit 10 so that a 5 V power voltage is accessed.

Figure 17:
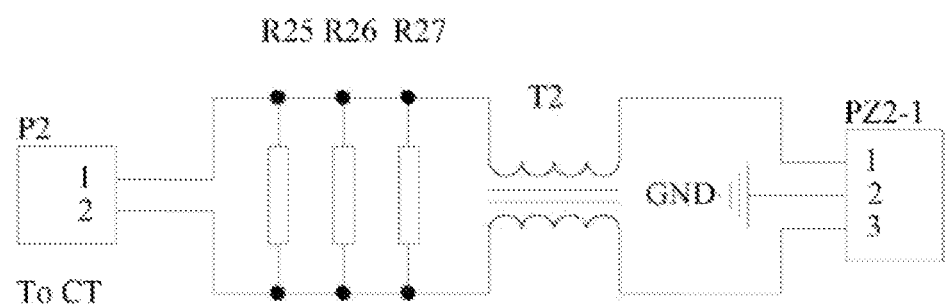
FIG. 17 is a schematic view showing a specific circuit structure of a current signal input circuit in FIG. 1.

As shown in FIG. 17, the current signal input circuit 13 includes a resistor R25, a resistor R26, a resistor R27, and a filter inductor T2; two ends of the resistor R25, two ends of the resistor R26, two ends of the resistor R27 and two input ends of the filter inductor T2 are all connected to two ends of the a transformer; and two output ends of the filter inductor T2 are both connected to the fault arc signal processing circuit 12 and are specifically connected to the first end of the resistor R30 and the first end of the resistor R41 in the current differential amplification circuit 1231. By disposing the filter inductor T2, a common-mode filtering effect may be achieved.

The above descriptions are not intended to limit the present disclosure, but merely as preferred embodiments thereof. Any alterations and variations of the present disclosure may be made by the skilled in the art. Any modifications, equivalent replacements, improvements, etc. made with the spirit and principle of the present disclosure should fall within the protection scope of the present disclosure.

What is claimed is:

1. A single-phase fault arc detector used to detect a single-phase fault arc, comprising: a power conversion circuit (10) connected to a live wire and neutral wire of a mains supply and configured to provide various power voltages and voltage sampling signals; a current signal input circuit (13) connected to a current transformer and configured to provide current sampling signals; a fault arc signal processing circuit (12) respectively connected to the power conversion circuit (10) and the current signal input circuit (13) and configured to process the voltage sampling signals and the current sampling signals and then output a voltage square wave signal, a voltage sine wave signal, a current sine wave signal, a current square wave signal, a current square shoulder pulse signal, and a current high-frequency pulse signal; and a processor (11) respectively connected to the power conversion circuit (10) and the fault arc signal processing circuit (12) and configured to determine, on the basis of the plurality of current signals and voltage signals output by the fault arc signal processing circuit (12) and in combination with a preset operation rule, whether there is a single-phase fault arc, wherein the fault arc signal processing circuit (12) comprises a voltage signal processing circuit (121) and a current signal processing circuit (122); the voltage signal processing circuit (121) is respectively connected to the power conversion circuit (10) and the processor (11) and is configured to respectively convert the voltage sampling signals into the voltage sine wave signal and the voltage square wave signal and then output the voltage sine wave signal and the voltage square wave signal to the processor (11); and the current signal processing circuit (122) is respectively connected to the current signal input circuit (13) and the processor (11) and is configured to respectively convert the current sampling signals into the current sine wave signal, the current square wave signal, the current square shoulder pulse signal and the current high-frequency pulse signal and then output the current sine wave signal, the current square wave signal, the current square shoulder pulse signal and the current high-frequency pulse signal to the processor (11).

2. The single-phase fault arc detector of claim 1, wherein the current signal processing circuit (122) comprises a square shoulder pulse signal extraction circuit (123) and a high-frequency pulse signal extraction circuit (124); the square shoulder pulse signal extraction circuit (123) is respectively connected to the current signal input circuit (13) and the processor (11) and is configured to respectively convert the current sampling signals into the current sine wave signal, the current square wave signal and the current square shoulder pulse signal and then output the current sine wave signal, the current square wave signal and the current square shoulder pulse signal to the processor (11); and the high-frequency pulse signal extraction circuit (124) is respectively connected to the square shoulder pulse signal extraction circuit (123) and the processor (11) and is configured to convert the current sine wave signal into the current high-frequency pulse signal and then output the current high-frequency pulse signal to the processor (11).

3. The single-phase fault arc detector of claim 2, wherein the square shoulder pulse signal extraction circuit (123) comprises a current differential amplification circuit (1231), an automatic gain amplification circuit (1232), a current positive square wave generation circuit (1233), a current negative square wave generation circuit (1234), a square shoulder pulse generation circuit (1235), and a first current shaping circuit (1236); the current differential amplification circuit (1231) is respectively connected to the current signal input circuit (13), the processor (11) and the automatic gain amplification circuit (1232) and is configured to perform primary amplification processing on the current sampling signals and respectively output the processed current sine wave signal to the processor (11) and the automatic gain amplification circuit (1232); the automatic gain amplification circuit (1232) is respectively connected to the processor (11), the current positive square wave generation circuit (1233) and the current negative square wave generation circuit (1234) and is configured to perform, under the control of the processor (11), secondary amplification processing on the current sine wave signal subjected to the primary amplification processing and output the current sine wave signal subjected to the secondary amplification processing; the current positive square wave generation circuit (1233) is configured to convert the current sine wave signal subjected to the secondary amplification processing into a 5.5 V current positive square wave signal; the current negative square wave generation circuit (1234) is configured to convert the current sine wave signal subjected to the secondary amplification processing into a current negative square wave signal; the square shoulder pulse generation circuit (1235) is respectively connected to the current positive square wave generation circuit (1233), the current negative square wave generation circuit (1234) and the processor (11) and is configured to superpose the current positive square wave signal and the current negative square wave signal, extract the current square shoulder pulse signal and then output the current square shoulder pulse signal to the processor (11); and the first current shaping circuit (1236) is connected to the current positive square wave generation circuit (1233) and is configured to convert the 5.5 V current positive square wave signal output by the current positive square wave generation circuit (1233) into a 3.3 V current positive square wave signal and then output the 3.3 V current positive square wave signal to the processor (11).

4. The single-phase fault arc detector of claim 3, wherein the current positive square wave generation circuit (1233) comprises a capacitor C25, a resistor R48, a resistor R59, a positive square wave generator U2B, a resistor R55, and a resistor R56; the first end of the capacitor C25 and the forward-phase input end of the positive square wave generator U2B are both connected to the automatic gain amplification circuit (1232); the second end of the resistor R48 is connected to the power conversion circuit (10), and the first end of the resistor R48 is respectively connected to the first end of the resistor R59 and the reversed-phase input end of the positive square wave generator U2B; the output end of the positive square wave generator U2B is respectively connected to the first end of the resistor R55, the first end of the resistor R56, and the first current shaping circuit (1236); the second end of the resistor R59, the second end of the capacitor C25 and the second end of the resistor R55 are all grounded; and the second end of the resistor R56 is connected to the square shoulder pulse generation circuit (1235).

5. The single-phase fault arc detector of claim 3, wherein the current negative square wave generation circuit (1234) comprises a resistor R49, a resistor R60, a negative square wave generator U2C, a capacitor C23, a capacitor C27, and a resistor R58; the reversed-phase input end of the negative square wave generator U2C is connected to the automatic gain amplification circuit (1232), and the forward-phase input end thereof is respectively connected to the first end of the resistor R49 and the first end of the resistor R60; the second end of the resistor R49, the first end of the capacitor C23 and a fourth pin of the negative square wave generator U2C are all connected to the power conversion circuit (10); an eleventh pin of the negative square wave generator U2C and the first end of the capacitor C27 are connected to the power conversion circuit (10); the output end of the negative square wave generator U2C is respectively connected to the first end of the resistor R58 and the first current shaping circuit (1236); and the second end of the resistor R58, the second end of the capacitor C23, the second end of the capacitor C27 and the second end of the resistor R60 are all grounded.

6. The single-phase fault arc detector of claim 3, wherein the square shoulder pulse generation circuit (1235) comprises a resistor R53, a capacitor C24, a NAND gate U3D, a capacitor C26, and a resistor R50; the first end of the resistor R53 is connected to the output end of the current negative square wave generation circuit (1234), and the second end of the resistor R53 is respectively connected to the first end of the capacitor C24 and the first input end of the NAND gate U3D; the second input end of the NAND gate U3D is respectively connected to the output end of the current positive square wave generation circuit (1233) and the first end of the capacitor C26; the output end of the NAND gate U3D is respectively connected to the processor (11) and the second end of the resistor R50; the first end of the resistor R50 is connected to the power conversion circuit (10); and the second end of the capacitor C24 and the second end of the capacitor C26 are both grounded.

7. The single-phase fault arc detector of claim 1, wherein the voltage signal processing circuit (121) comprises a voltage differential amplification circuit (1211) and a voltage shaping circuit (1212); the voltage differential amplification circuit (1211) is respectively connected to the power conversion circuit (10), the voltage shaping circuit (1212) and the processor (11) and is configured to perform primary amplification processing on the voltage sampling signals and respectively output the processed voltage sine wave signal to the voltage shaping circuit (1212) and the processor (11); and the voltage shaping circuit (1212) is respectively connected to the voltage differential amplification circuit (1211) and the processor (11) and is configured to sequentially perform secondary amplification processing and shaping processing on the voltage sine wave signal subjected to the primary amplification processing to convert the voltage sine wave signal into a voltage square wave signal and then output the voltage square wave signal to the processor (11).

8. The single-phase fault arc detector of claim 7, wherein the voltage differential amplification circuit (1211) comprises a resistor R14, a resistor R16, a resistor R13, a capacitor C20, a resistor R22, a differential amplifier U1D, a resistor R19, a resistor R20, and a capacitor C19; the first ends of the resistor R14 and the resistor R16 are connected to the power conversion circuit (10) so that the voltage sampling signals are accessed; the first end of the capacitor C20 is connected to the power conversion circuit (10) so that power voltages are accessed; the second end of the resistor R14 is respectively connected to the first end of the resistor R13 and the reversed-phase input end of the differential amplifier U1D; the second end of the capacitor C20 is connected to the first end of the resistor R22; the second end of the resistor R16 is respectively connected to the second end of the resistor R22 and the forward-phase input end of the differential amplifier U1D; the output end of the differential amplifier U1D is respectively connected to the second end of the resistor R13, the first end of the capacitor C19, and the voltage shaping circuit (1212); the second end of the capacitor C19 is respectively connected to the second end of the resistor R19, the first end of the resistor R20, and the processor (11); the first end of the resistor R19 is grounded; and the second end of the resistor R20 is connected to the power conversion circuit (10).

9. The single-phase fault arc detector of claim 7, wherein the voltage shaping circuit (1212) comprises a resistor R18, a differential amplifier U1C, a resistor R17, a capacitor C18, a NAND gate U3A, and a resistor R12; the first end of the resistor R18 is connected to the output end of the voltage differential amplification circuit (1211), and the second end thereof is connected to the forward-phase input end of the differential amplifier U1C; the reverse-phase input end of the differential amplifier U1C is grounded, and the output end thereof is connected to the first end of the resistor R17; the second end of the resistor R17 is respectively connected to the first end of the capacitor C18 and input ends of the NAND gate U3A; the second end of the capacitor C18 is grounded; the output end of the NAND gate U3A is respectively connected to the first end of the resistor R12 and the processor (11); and the second end of the resistor R12 is connected to the power conversion circuit (10).

* * * * *